(12) United States Patent
Go et al.

(10) Patent No.: US 6,296,789 B1
(45) Date of Patent: Oct. 2, 2001

(54) OPTICAL MODULE AND A METHOD OF FABRICATING THE SAME

(75) Inventors: Hisao Go; Shunichi Yoneyama, both of Kanagawa (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/252,909

(22) Filed: Feb. 19, 1999

(30) Foreign Application Priority Data

Feb. 20, 1998 (JP) .................................................. 10-038744
Mar. 16, 1998 (JP) .................................................. 10-065616

(51) Int. Cl.⁷ .............................. B29C 45/14; G02B 6/30
(52) U.S. Cl. ..................................... 264/1.25; 264/272.14; 264/272.15; 264/275; 264/279; 385/51; 385/52
(58) Field of Search ..................................... 264/1.1, 1.24, 264/1.25, 272.15, 275, 279, 272.14; 385/49, 51, 70, 73, 88, 52

(56) References Cited

U.S. PATENT DOCUMENTS

| | | |
|---|---|---|
| 4,810,557 | 3/1989 | Blonder . |
| 5,000,541 | 3/1991 | DiMarcello et al. . |
| 5,275,765 * | 1/1994 | Go et al. ............................. 264/1.25 |
| 5,496,435 * | 3/1996 | Abbott ............................ 264/272.15 |
| 5,617,495 | 4/1997 | Funabashi et al. . |
| 5,793,914 | 8/1998 | Sasaki . |

FOREIGN PATENT DOCUMENTS

| | | |
|---|---|---|
| 57-076509 | 5/1982 | (JP) . |
| 07-311948 | 6/1997 | (JP) . |
| 10-335573 * | 12/1998 | (JP) . |
| 11-237532 * | 8/1999 | (JP) . |

* cited by examiner

*Primary Examiner*—Mathieu D. Vargot
(74) *Attorney, Agent, or Firm*—McDermott, Will & Emery

(57) ABSTRACT

In the method of making an optical module in accordance with the present invention, an optical module principal portion is molded by means of a molding die. The molding die has a ferrule accommodating portion f or accommodating a ferrule and a positioning portion which are located on its lead frame-mounting surface. The method of making an optical module comprises the steps of: preparing a lead frame having an alignment portion enabling the positioning with respect to the mold die; preparing the optical module principal portion; aligning the optical module principal portion with the lead frame and securing them to each other by means of a positioning jig so that the ferrule secured to the optical module principal portion meets the ferrule accommodating portion of the molding die; placing the lead frame with the optical module principal portion secured thereto on the molding die; and resin-molding the lead frame and the optical module principal portion by means of the molding die.

11 Claims, 14 Drawing Sheets

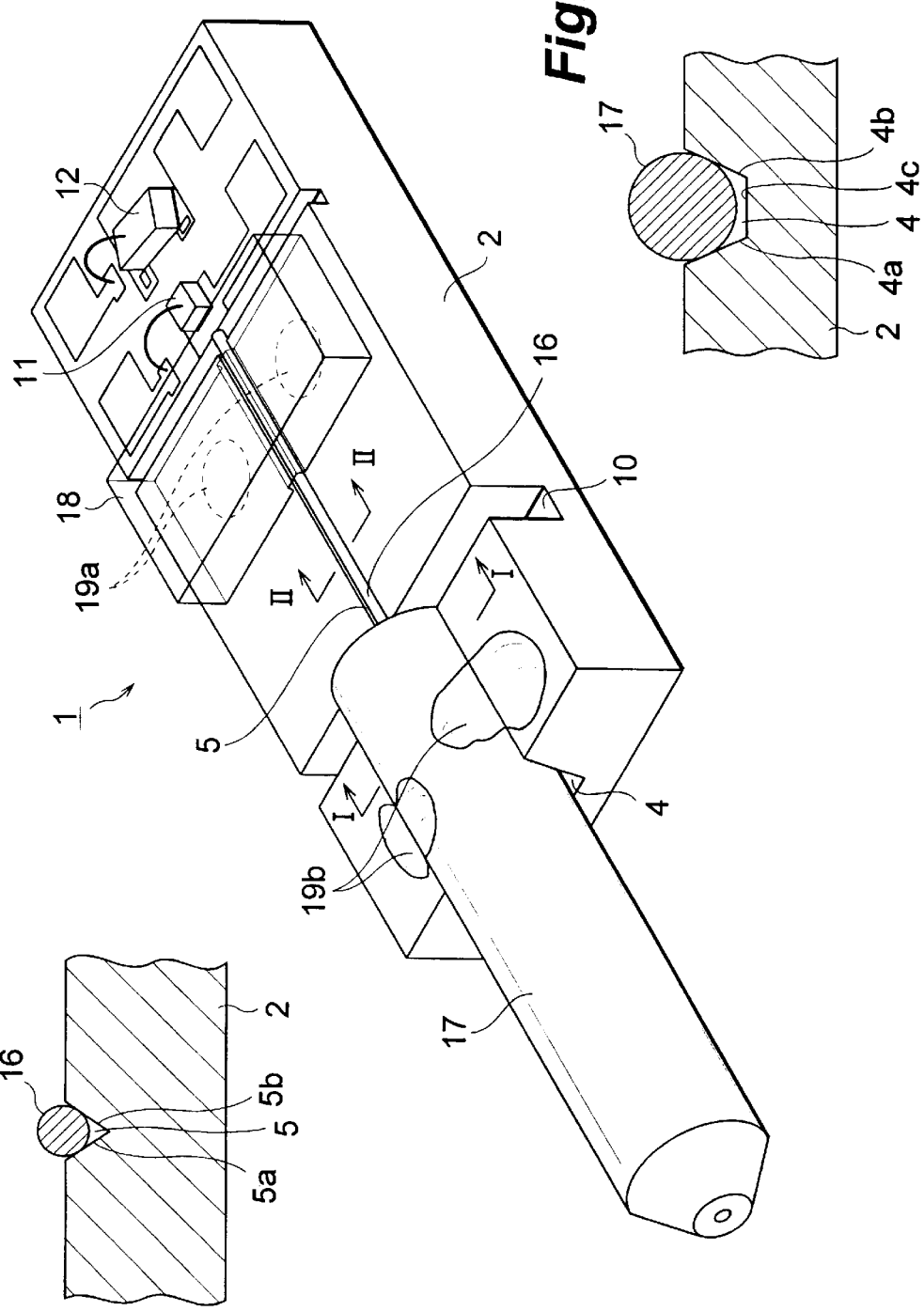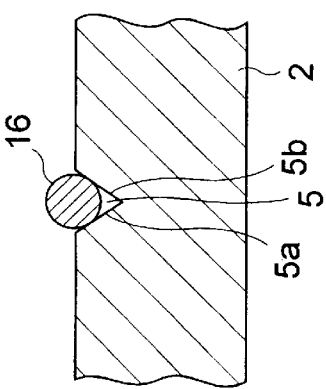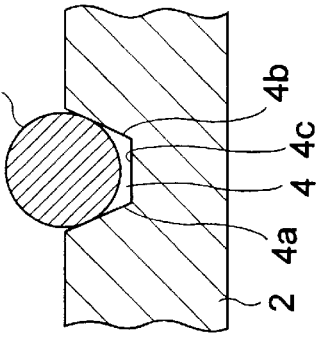

OPTICAL MODULE AND A METHOD OF FABRICATING THE SAME

BACKGROUND OF THE INVENTION

1. Field of the Invention

The present invention relates to a method of making an optical module encapsulated by means of resin molding, and the optical module.

2. Related Background Art

An optical module mounting a ferrule and a laser diode on a substrate and molded with resin is in the research-and-development stage.

SUMMARY OF THE INVENTION

There have been no reports in academic meetings and the like on what method is excellent in terms of mass-productivity for making the above-mentioned optical module.

Having studied the prior art, the inventor has found the following problems.

In the optical module to be resin-molded, the substrate has an optical fiber support groove for placing an optical fiber and a ferrule support groove for placing a ferrule. In such a substrate, the optical fiber is disposed in the optical fiber support groove, whereas the ferrule is disposed in the ferrule support groove. After the substrate on which the ferrule and the optical fiber are placed is mounted on a lead frame, this lead frame is attached to a transfer molding die and resin-molded. Before the resin molding, highly accurate positioning between the ferrule and the lead frame is needed.

Such a resin-molded optical module is required to be mass-produced. For this purpose, when the lead frame is placed in the transfer mold die, it is necessary to position the ferrule installed on the substrate and the ferrule attachment groove of the transfer mold die with respect to each other in a simple method.

It is an object of the present invention to provide a method of making a resin-molded optical module efficiently, and the optical module manufactured in this method.

In the method of making an optical module in accordance with the present invention, an optical module principal portion including an optical device, an optical fiber optically coupled to this optical device, and a ferrule covering the side face of the optical fiber is molded by means of a molding die. The molding die has a ferrule accommodating portion for accommodating the ferrule and a positioning portion which are located at its lead frame mounting surface.

The method of making an optical module in accordance with the present invention comprises the steps of: preparing a lead frame having an alignment hole allowing the lead frame to be positioned with respect to the positioning portion of the molding die; preparing the optical module principal portion; aligning the optical module principal portion with the lead frame by means of a positioning jig so that the ferrule included in the optical module principal portion meets the ferrule accommodating portion of the mold die; securing the aligned optical module principal portion to the lead frame; placing the lead frame with the optical module principal portion secured thereto at the mold die; and resin-molding the lead frame and the optical module principal portion by means of the mold die.

The step of aligning can comprise the steps of: preparing a jig; placing the lead frame on the jig such that the alignment hole of the lead frame is aligned with a lead frame positioning portion of the jig; and placing the optical module principal portion on the lead frame placed on the jig such that the ferrule included in the optical module principal portion is located at a ferrule attachment portion.

This jig has the ferrule attachment portion and lead frame positioning portion corresponding to the ferrule accommodating portion and positioning portion of the mold die, respectively. The ferrule attachment portion and lead frame-positioning portion of the jig allow the optical module principal portion to be positioned with respect to the lead frame.

The lead frame positioning portion of the jig can be a protrusion portion to be inserted into the alignment hole provided in the lead frame. The positioning portion of the molding die can be a protrusion portion to be inserted into the alignment hole formed in the lead frame.

In the step of preparing the optical module principal portion, the optical fiber and the ferrule are placed on a substrate having first, second, and third regions along a predetermined axis. For this placement, the step of preparing the optical module principal portion includes the steps of: forming a ferrule support groove for supporting the ferrule and an optical fiber support groove for supporting the optical fiber in the first and second regions at the same time; mounting the optical device on the third region; and placing the optical fiber and the ferrule in the optical fiber support groove and the ferrule support groove, respectively, such that the optical fiber can be optically coupled to the optical device.

Such a jig has the ferrule attachment portion and lead frame positioning portion associated with the ferrule accommodating portion and positioning portion of the molding die in their positions, respectively. The lead frame is placed on the jig such that the alignment hole is aligned with the positioning portion, and the optical module principal portion is mounted on the lead frame such that the ferrule is aligned with the ferrule attachment portion. When the lead frame with the optical module principal portion mounted thereon is aligned with the positioning portion on the molding die, then the ferrule is placed in the ferrule accommodating portion of the molding die. Thus, the optical module principal portion having the ferrule projecting from the substrate can be aligned with the lead frame and the mold die in a simple method.

BRIEF DESCRIPTION OF THE DRAWINGS

FIG. 5A shows a step of placing a ferrule,

FIG. 5B shows the optical fiber secured to an optical fiber support groove, and

FIG. 5C shows the ferrule secured to a ferrule support groove;

DETAILED DESCRIPTION OF THE PREFERRED EMBODIMENTS

With reference to the accompanying drawings, embodiments of the present invention will be explained. Parts identical or similar to each other will be referred to with identical numerals or letters if possible, without repeating their overlapping explanations.

Figure 1:
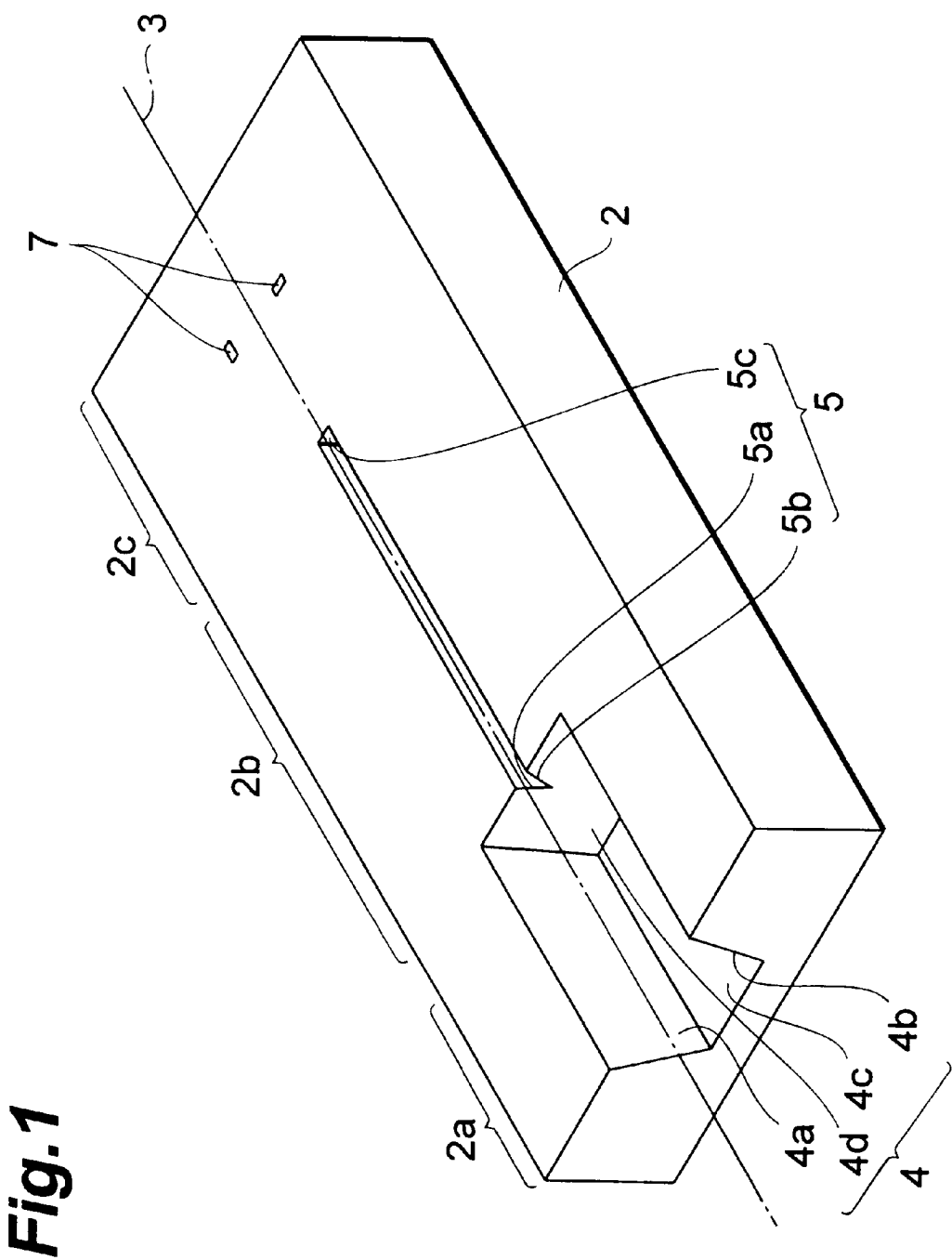
FIG. 1 shows an optical module substrate in which grooves are formed.

FIG. 1 shows an optical module substrate. Referring to FIG. 1, the substrate 2 has a first region 2a, a second region 2b, and a third region 2c along a predetermined axis 3.

In the first region 2a, a ferrule support groove 4 for supporting a ferrule is formed. In order to support the ferrule, the ferrule support groove 4 has two side faces 4a, 4b and a bottom face 4c held between these two side faces. The ferrule support groove 4 is formed so as to extend from one end face of the substrate 2 while being centered at the axis 3. The groove 4 has a trapezoidal cross section.

In the second region 2b, an optical fiber support groove 5 for supporting an optical fiber is formed. In order to support the optical fiber, the optical fiber support groove 5 has two side faces 5a, 5b. The optical fiber support groove 5 is formed on the surface of the substrate 2 along the axis 3. The groove 5 has a V-shaped cross section.

The ferrule support groove 4 has a tapered surface 4d at the boundary between the ferrule support groove and the optical fiber support groove 5. The optical fiber also support groove 5 has a tapered surface 5c at one end thereof.

The third region 2c has markers 7 for determining the position at which an optical device is placed.

The ferrule support groove 4, the optical fiber support groove 5, and the markers 7 are formed simultaneously as follows. A mask pattern is formed on the surface of the substrate 2 with a photolithography method. A silicon substrate is preferably employed as the substrate 2. In this case, (100) face is employed as the surface orientation of the silicon substrate, while a KOH solution is employed as an etchant. Since the etching rate varies depending on the surface orientation of silicon, it is possible to use a property that (111) surfaces with the slowest etching rate appear. By adjusting the etching time and the width of the mask pattern for each groove, the grooves 4, 5 to be formed can have a V-shaped or trapezoidal cross section as in the embodiment shown in FIG. 1. Each of the two side faces (surfaces equivalent to (111) surface of silicon) constituting each of grooves 4, 5 forms an obtuse angle with the surface of their corresponding region 2a, 2b in the substrate 2.

Figure 2:
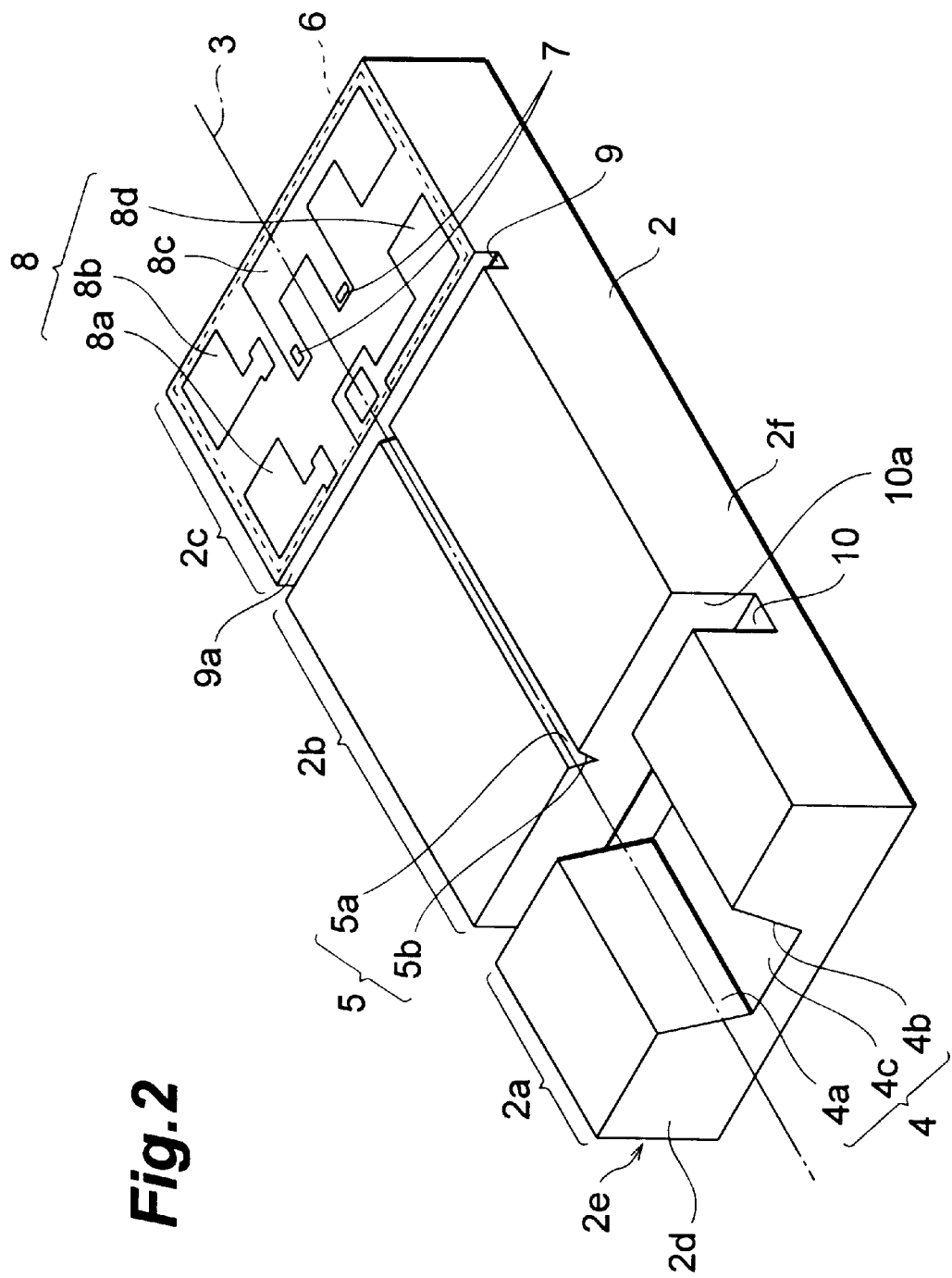
FIG. 2 shows an optical module substrate.

Referring to FIG. 2, a positioning groove 9 and a connection groove 10 is formed on the substrate 2.

The substrate 2 has a positioning groove 9 for positioning the optical fiber. The positioning groove 9 is formed so as to separate the second region 2b and the third region 2c from each other. The positioning groove 9 is provided at one end portion of the optical fiber support groove 5 and intersects the optical fiber support groove 5 at a predetermined angle, e.g., 90°. The positioning groove 9 is a rectangular groove, deeper than the optical fiber support groove 5, having a side face 9a. The positioning groove 9 can be formed by dicing.

The substrate 2 has a connection groove 10 formed so as to separate the first region 2a and the second region 2b from each other. The connection groove 10 is placed between the optical fiber support groove 4 and the ferrule support groove 5. The connection groove 10 intersects the optical fiber support groove 4 and the ferrule support groove 5 at the angle of 90°, for example. The connection groove 10 can be formed by dicing across the substrate 2 between a pair of opposed side faces 2e, 2f. The connection groove 10 is a rectangular groove, deeper than the ferrule support groove 5, having a side face 10a which intersects the predetermined axis.

When the optical fiber support groove 5 and the ferrule support groove 4 are formed by etching, a tapered surface (4d in FIG. 1) sloping from the optical fiber 5 support groove toward the ferrule support groove 4 is formed at the boundary between the optical fiber support groove 5 and the ferrule support groove 4. The connection groove 10 is formed so as to eliminate this tapered surface. As a result, the ferrule placed in the ferrule support groove 4 can approach the optical fiber support groove 5. An end portion of the optical fiber support groove 5 has a tapered surface (5c in FIG. 1). The positioning groove 9 is formed so as to eliminate this tapered surface.

The third region 2c has an optical device mount portion 6. The substrate 2 as shown in FIG. 2 is preferable to optically couple a semiconductor light-emitting device (11 in FIG. 3) to the optical fiber. A semiconductor light-emitting device such as semiconductor laser is placed at the optical device mount portion 6. For monitoring the light-emitting state of this semiconductor laser, a monitor light-receiving device (12 in FIG. 3) such as photodiode can be provided. The optical device mount portion 6 has electrodes 8a, 8b, 8c, 8d.

Figure 3:
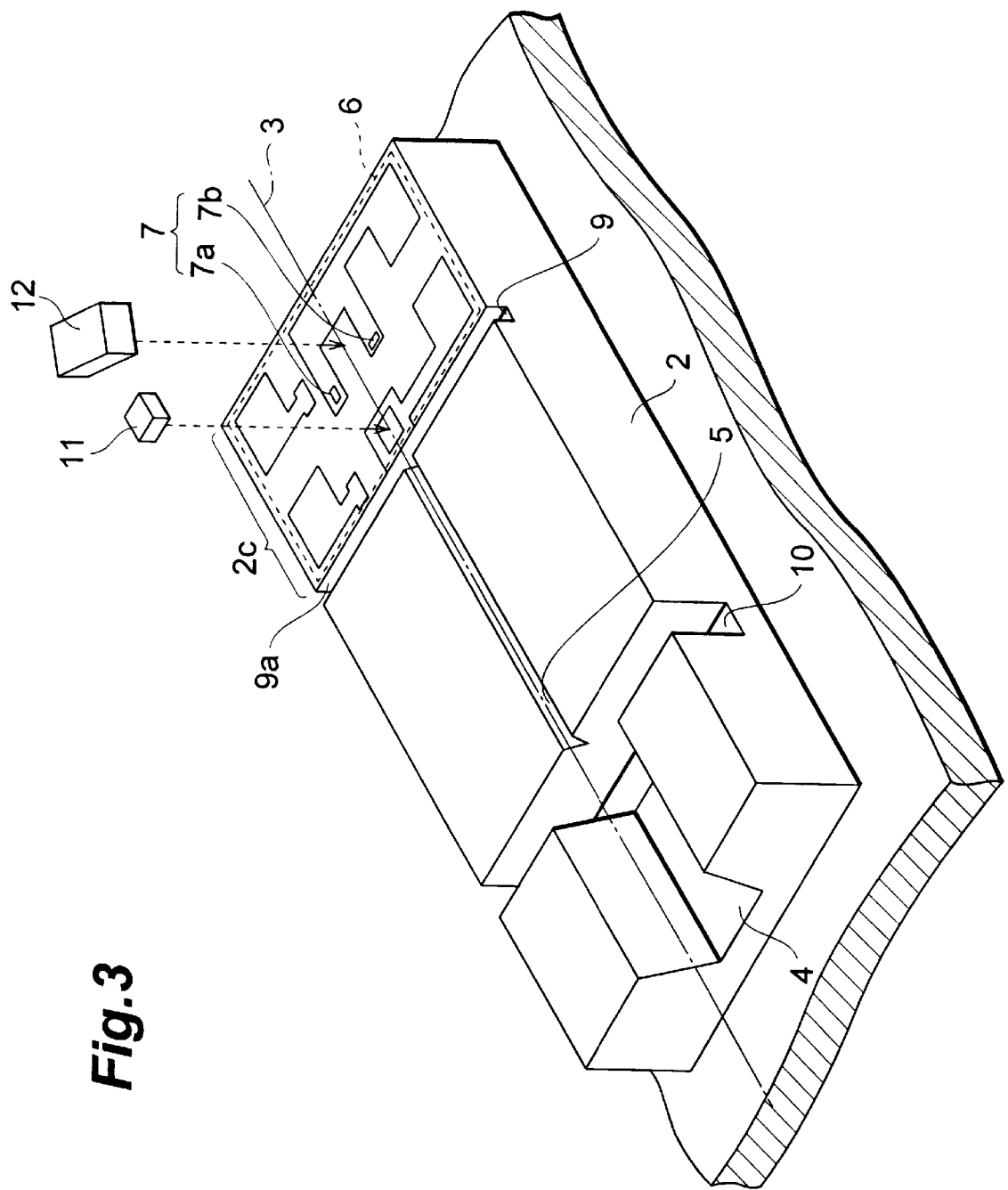
FIG. 3 shows the substrate in a step of mounting an optical device onto the substrate.

FIG. 3 shows a step in which an optical device is mounted onto the substrate 2. Referring to FIG. 3, the optical device is arranged at the optical device mount portion 6 of the substrate 2. This optical device is optically coupled with the optical fiber. Such optical devices can include both semiconductor light-emitting devices and semiconductor light-receiving devices. The following explanation relates to a case where a semiconductor laser (LD) 11 and a monitor photodiode (PD) 12 are mounted as a semiconductor light-emitting device and a semiconductor light-receiving device, respectively.

The LD 11 is die-bonded to the optical device mount portion 6 on the substrate 2. The die bonding is carried out after a marker on the LD 11 is positioned with respect to a marker on the substrate 2 by use of image recognition. For achieving the reliable optical coupling of the LD 11 with the optical fiber (single-mode optical fiber: SMF) placed in the optical fiber support groove 4, a positioning accuracy of several micrometers or shorter is needed.

Subsequently, the PD 12 is die-bonded to the optical device mount portion 6 of the substrate 2. The die bonding is carried out after a marker on the PD 12 is positioned with respect to markers 7a, 7b on the substrate 2 by use of image recognition. The positioning accuracy required for this step is about 10 μm.

Figure 4:
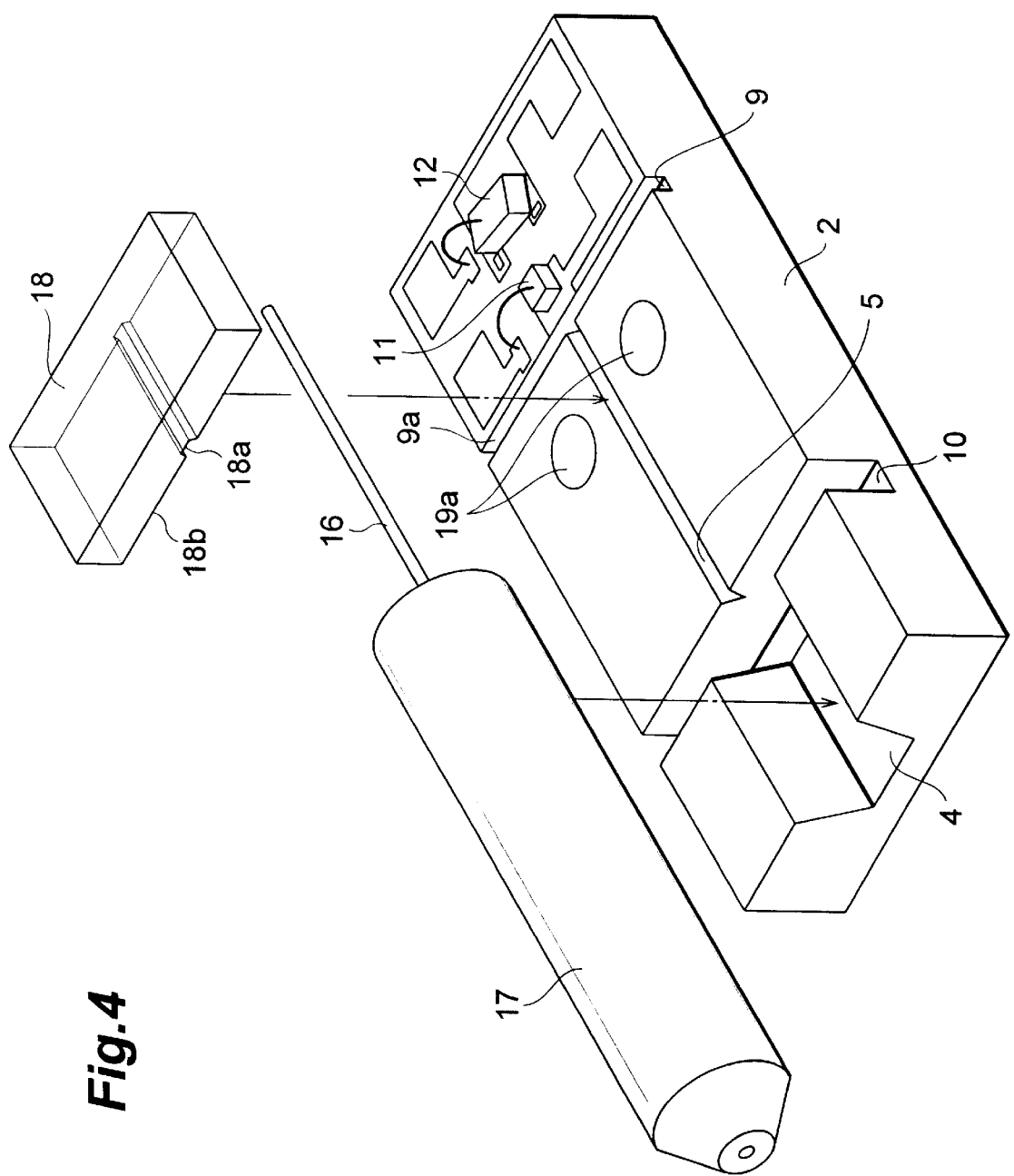
FIG. 4 shows a step of securing an optical fiber to the substrate.

FIG. 4 shows a step in which an optical fiber 16 is secured to the substrate 2. The optical fiber 16 inserted in a ferrule 17 and a securing member 18 are prepared. In this step, the optical fiber 16 is placed in the optical fiber support groove 5 of the substrate 2 and is secured thereto by means of the securing member 18. A UV-curing resin is dropped inside the second region of the substrate 2 at two positions so as to avoid the optical fiber support groove 5 and form resin members 19a. The optical fiber 16 is disposed in the optical fiber support groove 5 and is covered with the securing member 18. The securing member 18 has a groove 18a for holding the optical fiber 16 and a bonding surface 18b faced to the substrate 2. The optical fiber 16 is supported by three flat surfaces comprising the two side faces of the optical fiber support groove 5 and the bottom face of the groove 18a of the securing member 18. The securing member 18 is formed from UV-transparent material such as quartz.

FIG. 5A shows a step of securing the ferrule 17. The ferrule 17 with the optical fiber 16 inserted therein is disposed in the ferrule support groove 4. The UV-curing resin is also applied to the boundaries between the side face of the ferrule 17 and the first region 2a of the substrate 2 to form resin members 19b for securing the ferrule.

Thereafter, the resin members 19a, 19b made of UV-curing resin are irradiated with UV rays. The optical fiber 16 is secured by the securing member 18 and the resin members 19a, whereas the ferrule 17 is secured by the resin members 19b. Thus, an optical module principal portion 1 is completed.

Since the UV-curing resin is used for securing the ferrule 17 to the substrate 2, handling becomes easier after this step. A thermosetting resin can be also used in place of the UV-curing resin.

FIG. 5B is a sectional view showing the optical fiber 16 placed on the optical fiber support groove 5. The optical fiber 16 comes into contact with the two side faces 5a, 5b of the optical fiber support groove 5 so as to be supported by the groove 5.

FIG. 5C is a sectional view showing the ferrule 17 placed on the ferrule support groove 4. The ferrule 17 comes into contact with the two side faces 4a, 4b of the ferrule support groove 4 so as to be supported by the groove 4.

Figure 6:
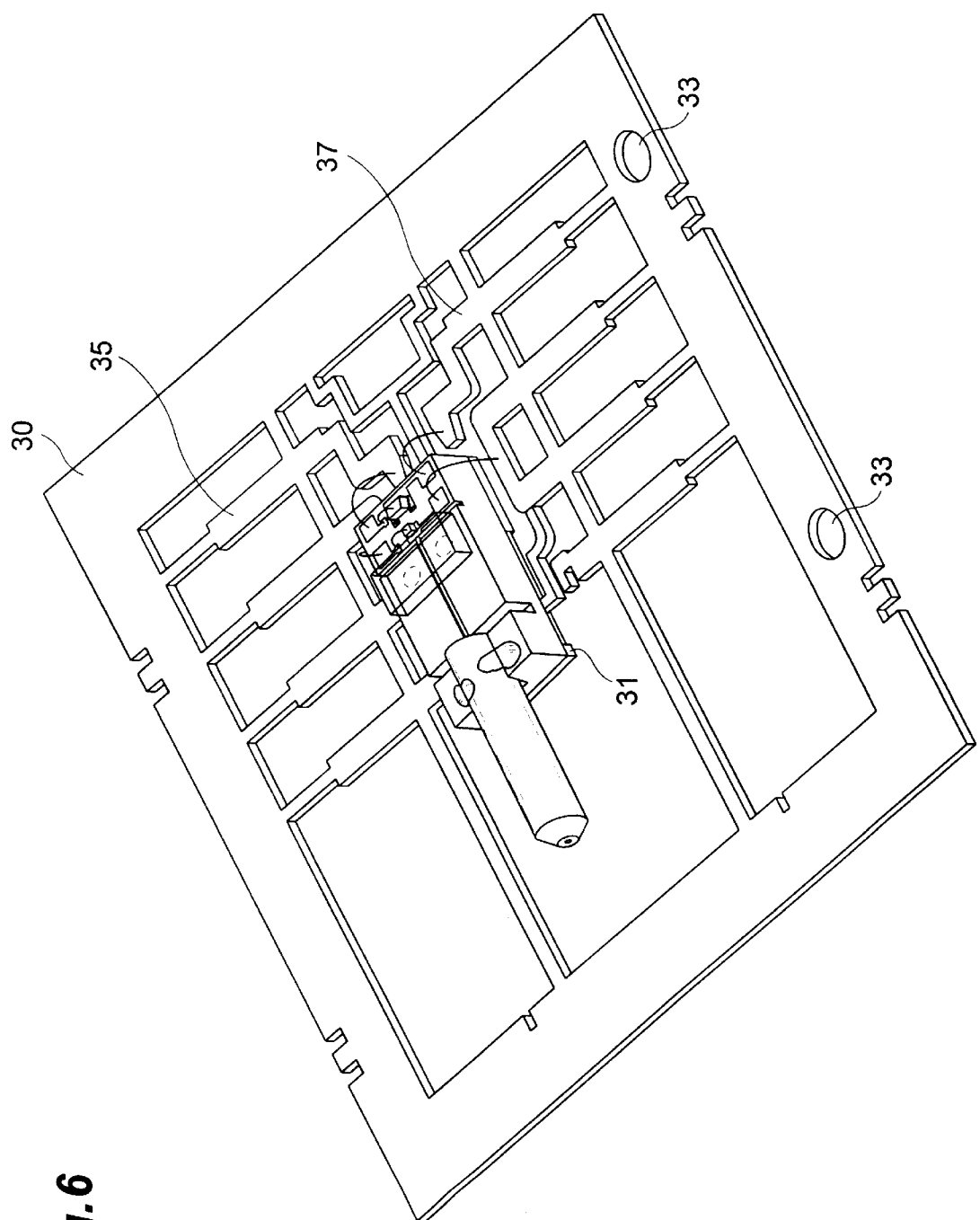
FIG. 6 shows a step of assembling an optical fiber principal portion on a lead frame.

FIG. 6 shows a step in which the optical module principal portion 1 is assembled with a lead frame 30. The optical module principal portion 1 is bonded to a die pad 31 of the lead frame 30. After the die pad 31 is coated with silver paste, the optical module principal portion 1 is mounted on the die pad 31. For example, the silver paste is heated under such conditions as 180° C. and 20 minutes be thermally cured. In bonding, the ferrule 17 is to positioned with respect to the lead frame 30.

Thereafter, the optical module principal portion 1 is wire-bonded to the inner leads 37 of the lead frame 30.

Figure 7:
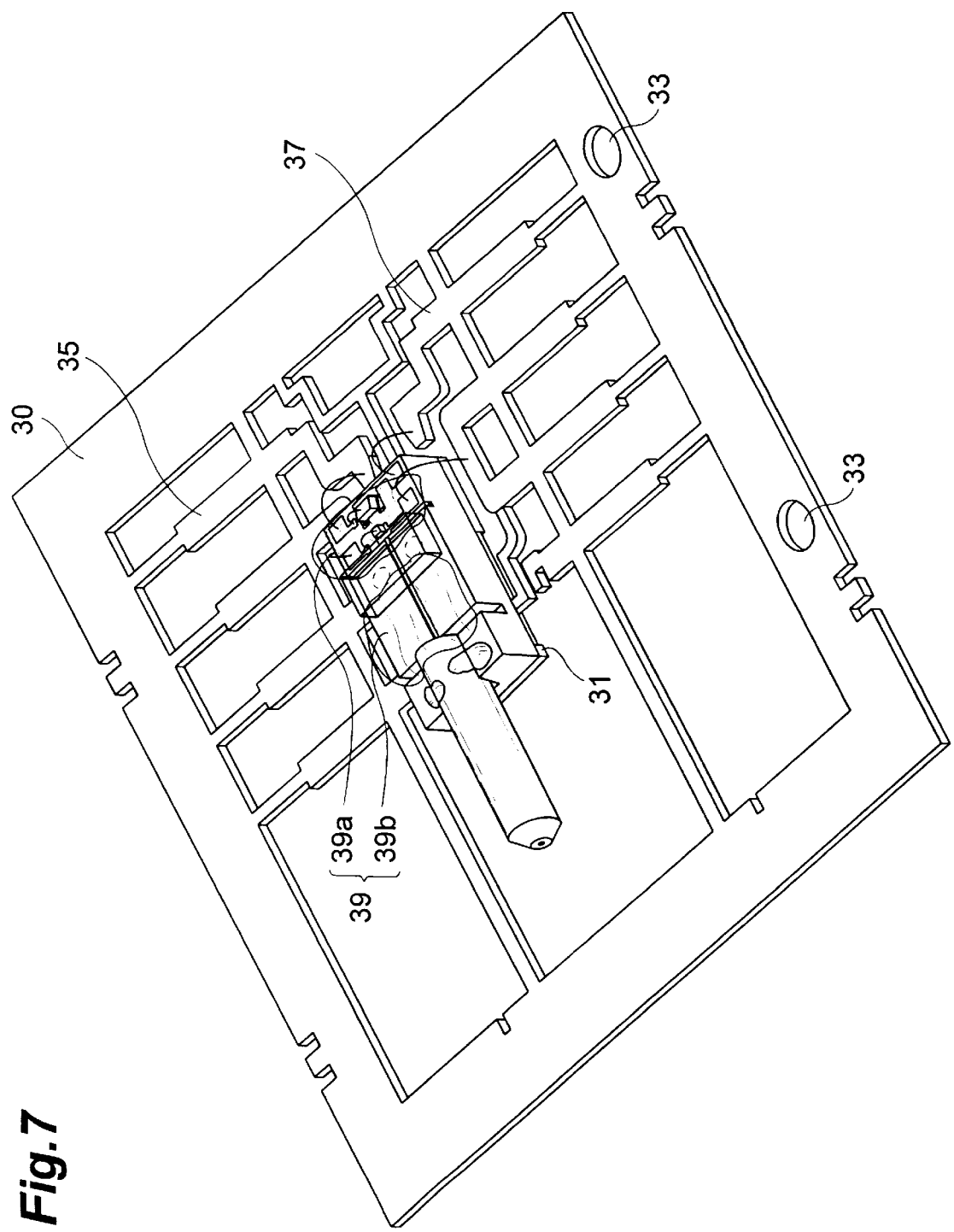
FIG. 7 shows a potting step in which a resin is dropped on the optical module principal portion.

FIG. 7 shows a potting step in which a protective resin is dropped onto the optical module principal portion 1. It is desirable that the potting be effected at two positions on the optical module principal portion.

One of the two positions lies in the region including the LD 11, the PD 12, and the end portion of the optical fiber 16 optically coupled to the LD 11. The potting resin is transparent to the wavelength of light generated by the LD 11. A potting resin body 39a ensures an optical path between the LD 11, and the PD 12 and optical fiber 16.

The other position lies in the region covering the optical fiber 16 exposed on the substrate 2. Molding materials used in transfer molding contracts upon curing. When the optical fiber is covered with a potting resin body 39b, then the influence of the contraction on the optical fiber can be reduced.

For forming the potting resin bodies 39a, 39b, any of UV-curing resins and thermosetting resins can be employed. These materials have low modulus of elasticity, thereby lowering the stress applied to the optical fiber 16 due to the contraction upon the curing of the resins and due to the thermal expansion and contraction of the resins. It is desirable that the resin be degassed under reduced pressure prior to curing the resin so as to prevent bubbles from occurring within the resin.

Figure 8:
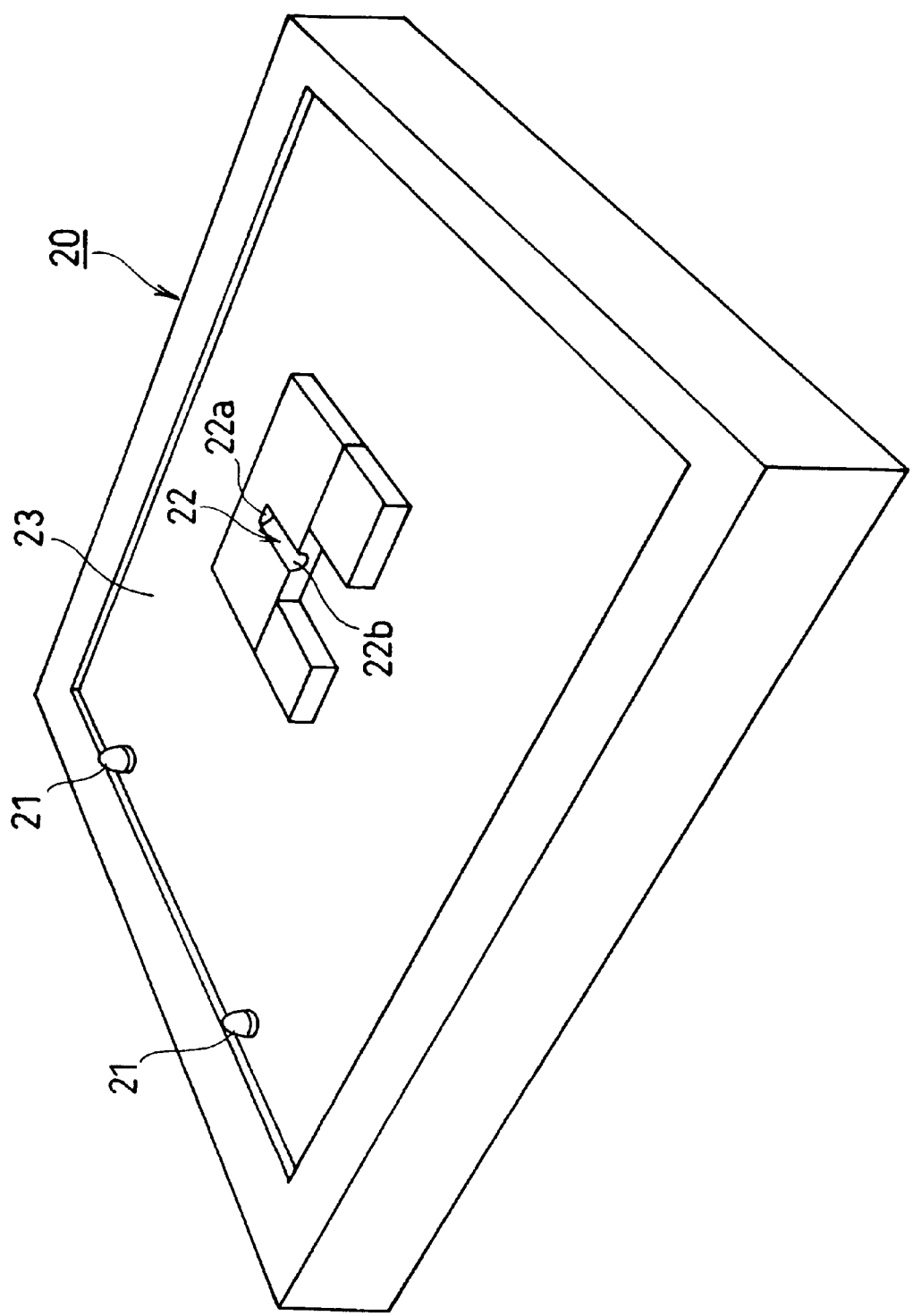
FIG. 8 is a perspective view of a jig used in an embodiment of the present invention.

Before explaining a method of making an optical module in detail, a jig used in this method will be explained with reference to FIG. 8. FIG. 8 is a schematic view of a jig 20 used in an embodiment. In the following, explanations for a mold encapsulation die employed as the mold die will be provided.

As shown in FIG. 8, the jig 20 comprises lead frame positioning portions 21 and a ferrule attachment portion 22 which are located on its lead frame mounting surface 23. The lead frame positioning portions 21 are used for positioning the lead frame (30 in FIG. 10) on this jig. The ferrule attachment portion 22 is used for determining the position at which the optical module principal portion 1 mounted with the ferrule is mounted on the die pad (31 in FIG. 10) of the lead frame (30 in FIG. 10).

Figure 10:
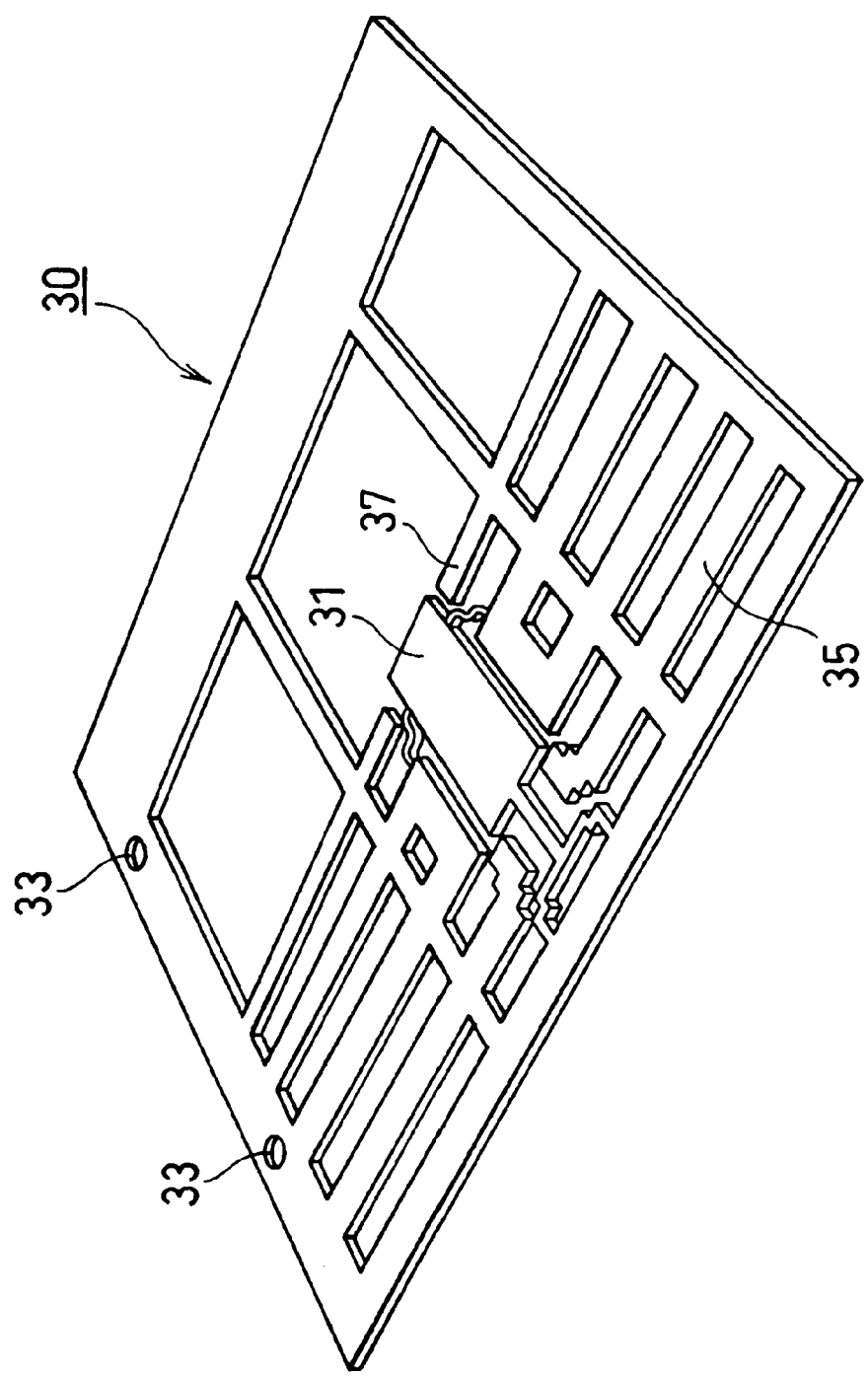
FIG. 10 is a perspective view of the lead frame used in the embodiment of the present invention.

The positions of lead frame positioning portions 21 are determined so as to correspond to the respective positions of alignment holes 33 of the lead frame 30 shown in FIG. 10. The forms of lead frame positioning portions 21 are also determined so as to correspond to the respective forms of alignment holes 33 in the lead frame. The pin of each lead frame positioning portion 21 has a circular cross section. This form corresponds to the form of each alignment hole 33 in the lead frame as will be mentioned later. Since the circular cross section of the pin continuously reduces its radius toward the tip of the pin, it provides the easier attachment of the lead frame 30 to this jig. The cross section of the pin can be also square, rectangular, elliptical, or the like.

The form of the ferrule attachment portion 22 corresponds to the form and position of the ferrule mounted on the optical module principal portion 1. The ferrule mounted on the optical module principal portion 1 has a cylindrical form. The cross-sectional form of the ferrule attachment portion 22 has an arc whose curvature corresponds to that of the ferrule. The form of the ferrule attachment portion 22 is not limited to an arc as long as the ferrule 17 can be positioned thereby. For example, a groove having a V-shaped or rectangular cross section can be employed as well.

In FIG. 8, the jig 20 comprises two lead frame positioning portions 21. The position of the flat lead frame 30 can be determined uniquely within the plane of the lead frame mounting surface 23, The lead frame positioning portions 21 and ferrule attachment portion 22 of the jig 20 should be formed at the respective positions corresponding to the positioning portions 41 and ferrule accommodating portion 42 of the mold die 40 shown in FIG. 9.

Figure 9:
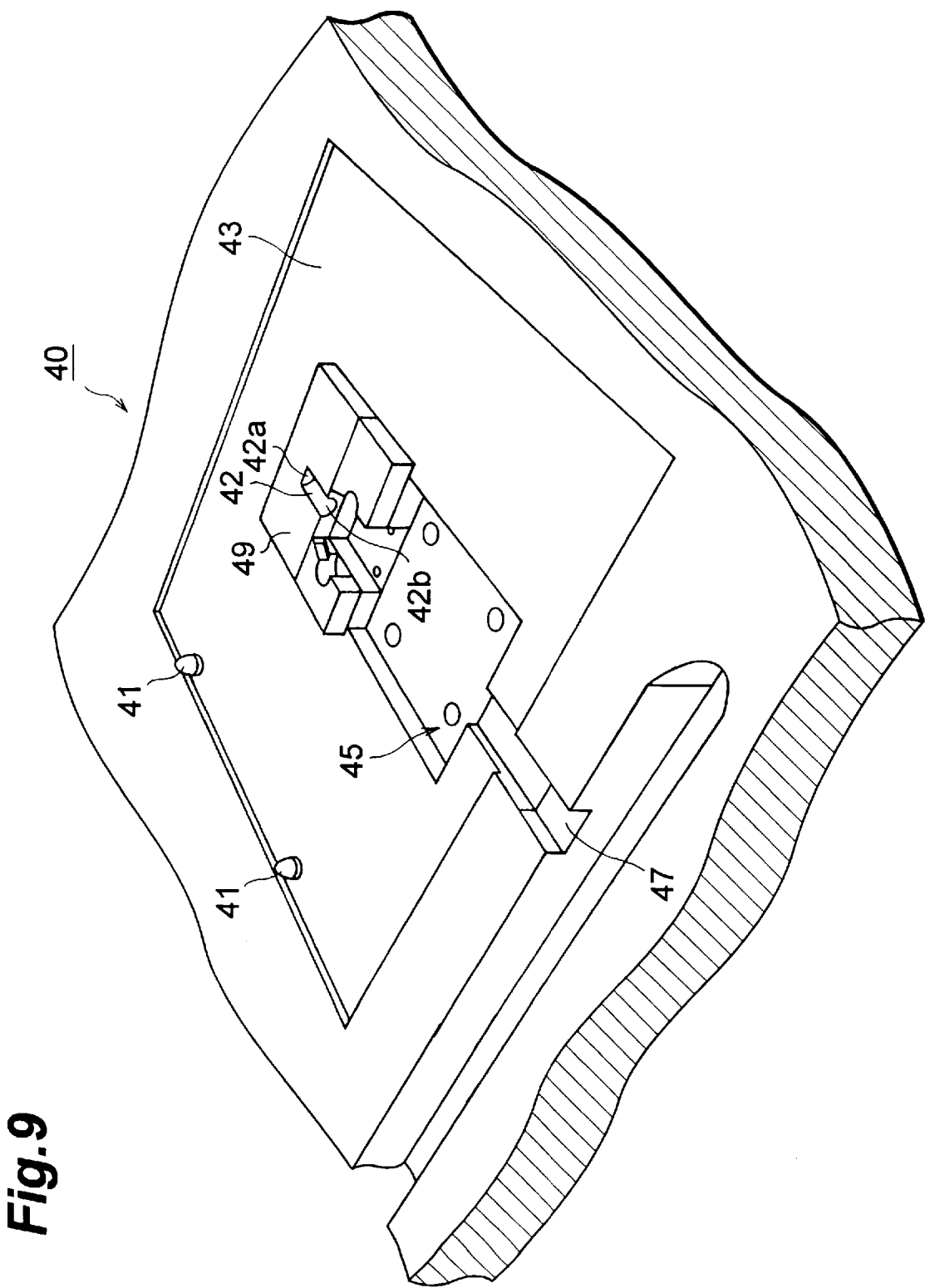
FIG. 9 is a perspective view of a molding die used in the embodiment of the present invention.

The mold die will now be explained. FIG. 9 is a perspective view of a lower mold die. The mold die 40 comprises the positioning portions 41, the ferrule accommodating portion 42, and a cavity portion 45. The positioning portions 41 define the position at which the lead frame 30 should be disposed on the lead frame mounting surface 43. The ferrule accommodating portion 42 accommodates the ferrule. A mold resin is introduced into the cavity portion 45 from a resin injection gate 47.

In the lower die 40 of the mold encapsulation die, the positioning pins 41 have forms determined so as to correspond to the respective forms of alignment holes (33 in FIG. 10) of the lead frame as well. Each positioning pin 41 has a circular cross section. The cross-sectional form of each positioning pin 41 corresponds to that of each alignment hole 33 of the lead frame. Since the circular cross section of the positioning pin 41 continuously reduces its radius toward the tip as in the jig 20, it provides the easier placement of the lead frame 30 in this molding die. The form of the ferrule accommodating portion 42 also corresponds to the form of the ferrule mounted to the optical module principal portion 1 as in the jig 20. The side face 42b of the ferrule receiving portion 42 is formed so as to match the side face of the ferrule cylinder. An end face 42a is formed so as to be able to accommodate the ferrule to its tip. Two positioning pins 41 are provided as in the jig 20.

FIG. 10 is a perspective view of the lead frame 30. Referring to FIG. 10, the configuration of the lead frame 30 will be explained. The lead frame 30 comprises the alignment holes 33 formed so as to correspond to the positioning portions 21 of the jig 20 and the positioning portions 41 of the mold die 40. The alignment holes 33 are formed at the outer peripheral portion of the lead frame. In the example shown in FIG. 10, each alignment hole 33 has a circular form. The diameter of this circular cross section is substantially the same as the diameter of the circular cross section at the bottom of each of the pins in the lead frame positioning portions 21 and positioning portions 41.

Figure 11:
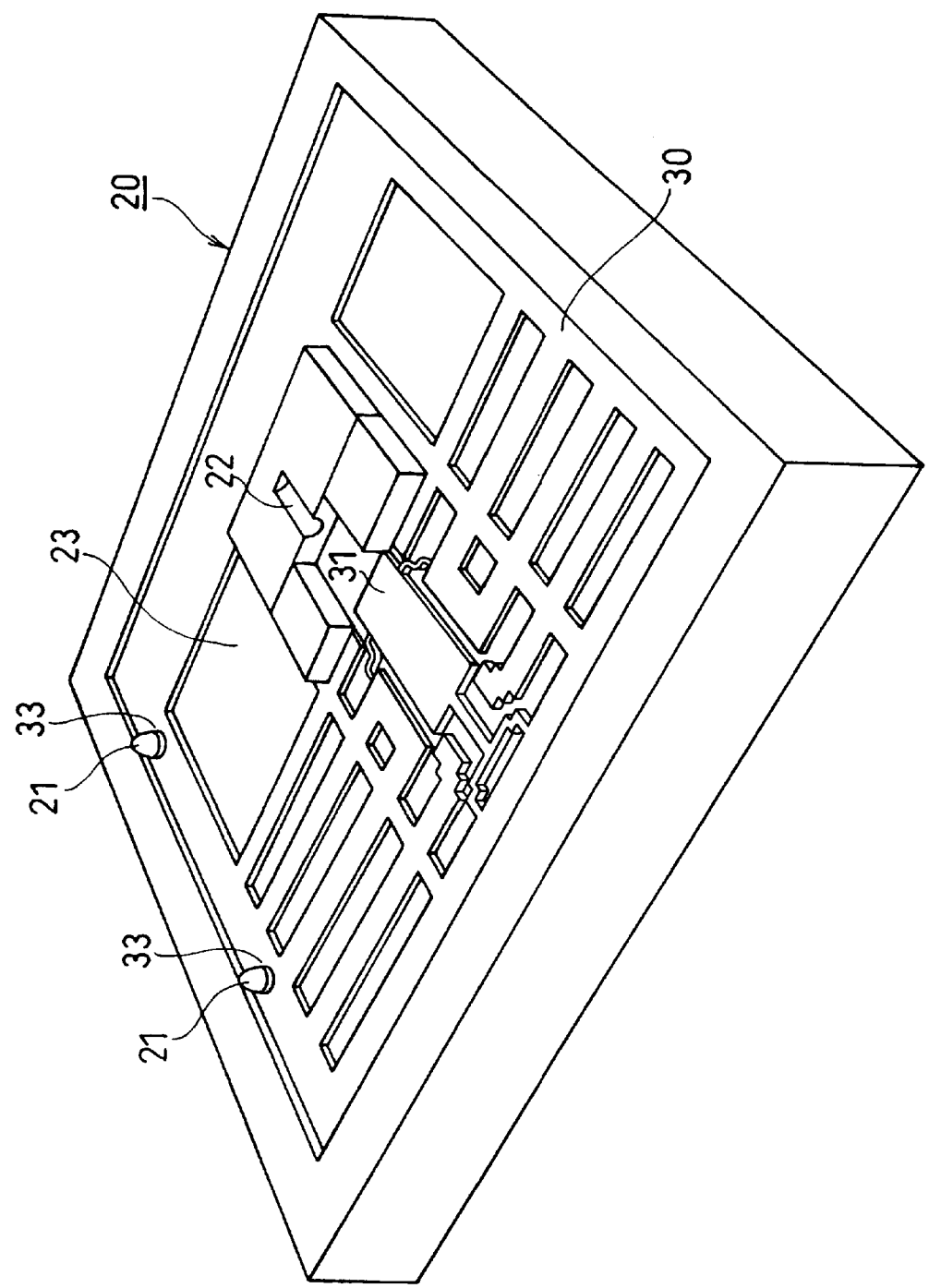
FIG. 11 is a perspective view of a step in which the lead frame is disposed on the jig of FIG. 8.
Figure 12:
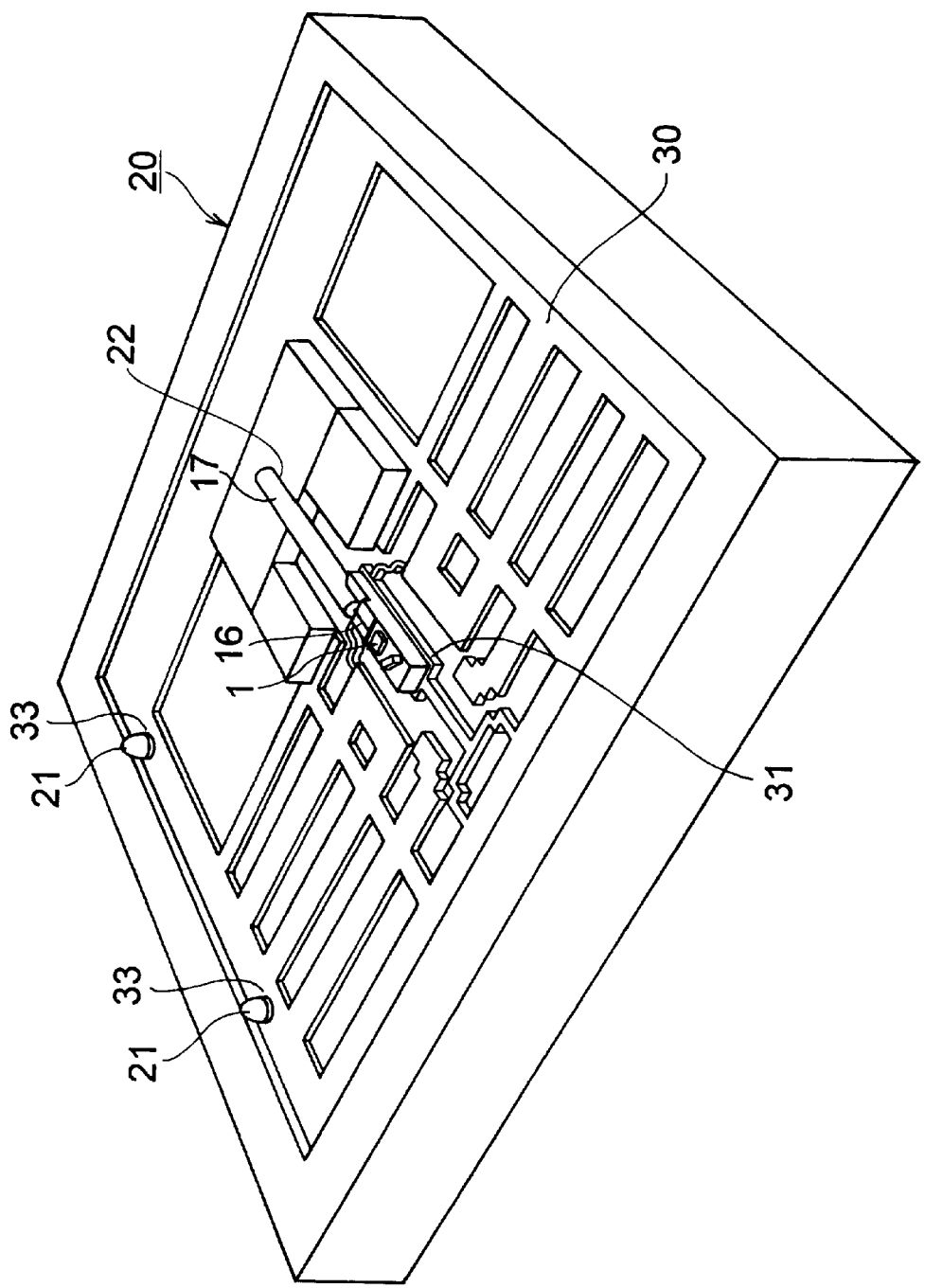
FIG. 12 is a perspective view of a step in which the substrate including the ferrule is mounted on the lead frame of FIG. 10.
Figure 13:
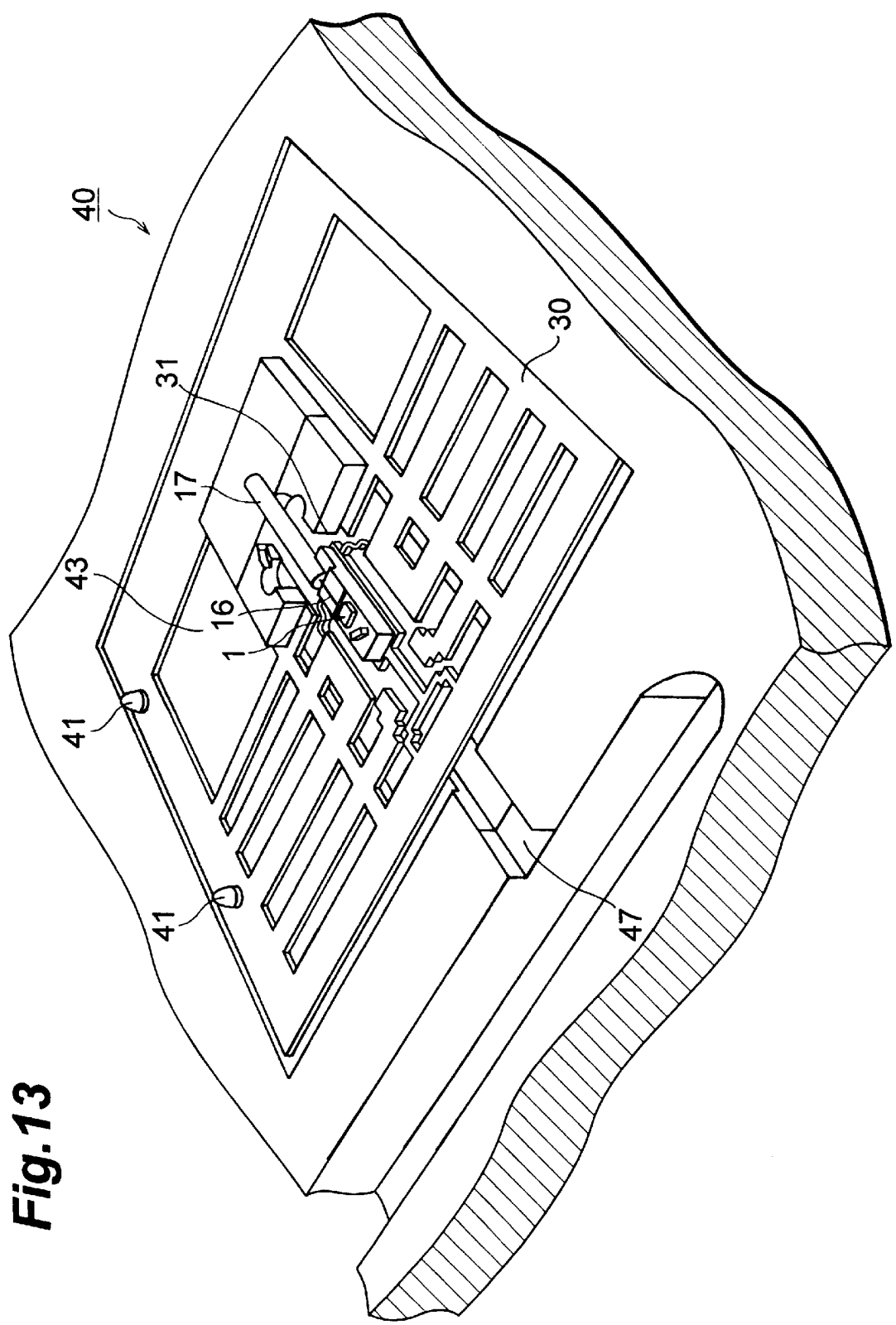
FIG. 13 is a perspective view of a step in which the lead frame mounting the optical module principal portion thereon is disposed in the molding die.

Explanation for the optical module principal portion 1 mounted on the lead frame 30 will be made with reference to FIGS. 11 to 13. FIG. 11 is a perspective view of a step in which the lead frame 30 is disposed on the jig 20 of FIG. 8. FIG. 12 is a perspective view of a step in which the optical module principal portion 1 is mounted on the lead frame 30. FIG. 13 is a perspective view of a step in which the lead frame 30 mounted with the optical module principal portion 1 is disposed in the molding die 40.

As shown in FIG. 11, the lead frame 30 is disposed on the lead frame mounting surface 23 of the jig 20. The pins of the lead frame positioning portions 21 formed in the jig 20 are inserted into their corresponding alignment holes 33 of the lead frame 30.

Subsequently, the optical module principal portion 1 is mounted on the die pad 31 of the lead frame 30 positioned on the jig 20, as shown in FIG. 12. The position of the optical module principal portion 1 is adjusted such that the ferrule 17 mounted thereon meets the ferrule attachment groove 22 of the jig 20. After the position is determined, the optical module principal portion 1 is bonded to the die pad 31. For the bonding, for example, silver paste is used. Thereafter, pads of the optical module principal portion 1 are connected to their corresponding inner leads 37 by means of bonding wires. In the following drawings, these wires are not illustrated for the sake of simplicity.

Thereafter, the lead frame 30 is placed on the lead frame mounting surface 43 of the mold die 40 shown in FIG. 13. The positioning pins 41 formed in the mold die 40 are inserted into their corresponding alignment holes of the lead frame 30. As the positioning pins 41 penetrate through their respective alignment holes 33 of the lead frame 30, the lead frame 30 is positioned at a predetermined position on the lead frame mounting surface 43.

The optical module principal portion 1 has already been positioned on the die pad 31 by means of the jig 20. When the alignment holes 33 of the lead frame 30 are aligned with their corresponding positioning portions 41 of the molding die 40, then the ferrule 17 mounted on the optical module principal portion 1 is accommodated in the ferrule accommodating portion 42.

Figure 14:
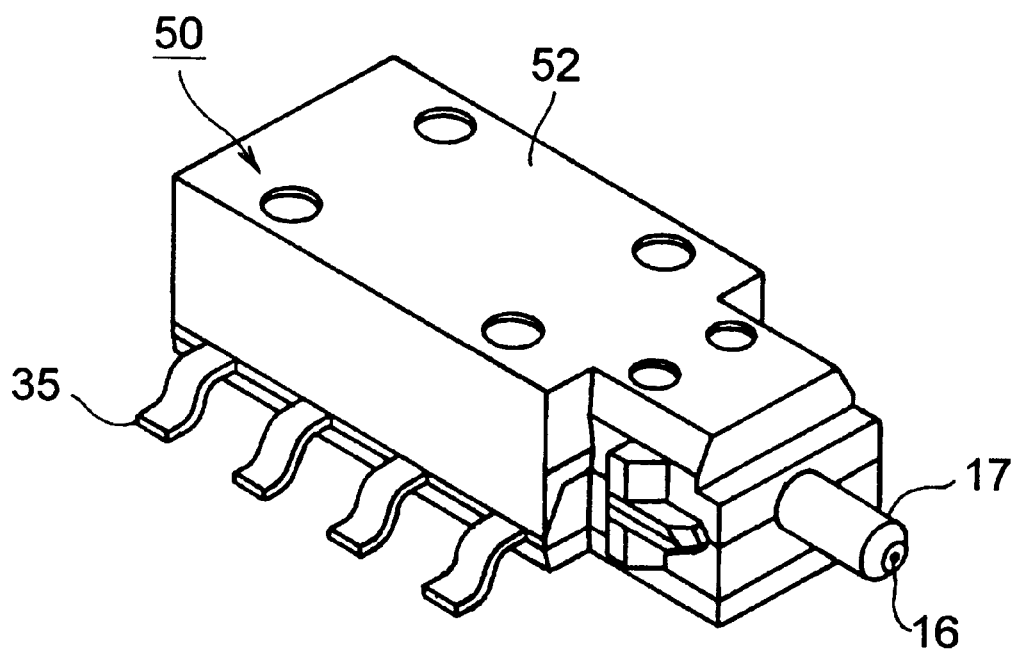
FIG. 14 is a perspective view of a completed optical module.

With an upper die (not illustrated) aligned with the molding die 40, resin is injected from the resin injection gate 47. After the resin is cured, an optical module with a resin mold body is taken out of the molding die 40. Lead forming completes an optical module 50 such as that shown in FIG. 14. The optical module 50 has the ferrule 17 projecting from one face (front face), lead pins 35, and a resin mold body 52.

In the method of making an optical module in accordance with the present invention, as explained in detail in the foregoing, the jig 20 is used for positioning the optical module principal portion 1 and the lead frame 30 with respect to each other in conformity to the mold die 40.

The lead frame 30 has the alignment holes 33 for positioning it with respect to the molding die 40. The molding die 40 comprises the ferrule accommodating portion 42 for attaching the ferrule 17 thereto and the positioning portions 41 for positioning the lead frame 30. The jig 20 is provided with the ferrule attachment portion 22 and lead frame positioning portions 21 corresponding to the ferrule corresponding portion 42 and lead frame positioning portions 21 in the molding die 40, respectively.

Such a jig 20 is used for placing the lead frame 30 such that the alignment holes 33 meet their corresponding lead frame positioning portions 21 of the jig 20. The optical module principal portion 1 is bonded onto the die pad 31 such that the ferrule 17 is aligned with the ferrule attachment portion 22.

The lead frame 30 with the optical module principal portion 1 bonded thereon is arranged in the molding die 40 such that the alignment holes 33 of the lead frame 30 corresponds to the positioning portions 41 of the mold die 40. As a result, the ferrule 17 mounted to the substrate 2 aligns with the ferrule accommodating portion 42 of the molding die 40. Hence, the lead frame 30 is accommodated in the mold die 40 in a state where the ferrule 17 secured to the optical module principal portion 1 aligns with the ferrule accommodating groove 42 of the mold die 40.

It is thus possible to provide a method of making an optical module in which no excess stress would be applied to the ferrule 17 even when the optical module principal portion 1 provided with the LD 11, optical fiber 16, and ferrule 17 is resin-molded.

When the optical fiber support groove 5 and the ferrule support groove 4 are formed on the same substrate 2, then the forms of these grooves 4, 5 would change according to the same coefficient of thermal expansion. Hence, even when the ferrule support groove 4 and the optical fiber support groove 5 thermally expand and contract upon changes in temperature of the environment where the optical module is used, the force applied to the optical fiber and ferrule from the substrate 2 is reduced. Also provided is an optical module whose characteristics against thermal stress in heat cycle tests are improved.

The positioning portions 41 and the lead frame positioning portions 21 are inserted into their corresponding alignment holes 33 of the lead frame 30. With this simple structure, the relative positions of the lead frame 30 and ferrule 17 can be determined promptly.

What is claimed is:
1. A method of making an optical module in which an optical module principal portion is molded by means of a mold die, said mold die having a ferrule receiving portion for accommodating a ferrule and a positioning portion which are located at a lead frame mounting surface; said method comprising the steps of:

preparing a lead frame having an alignment hole for enabling positioning with respect to said positioning portion of said mold die;

preparing said optical module principal portion; said optical module principal portion including an optical device, an optical fiber optically coupled to said optical device, and a ferrule covering a side face of said optical fiber;

securing said lead frame and said optical module principal portion to each other by means of a positioning jig so that said ferrule included in said optical module principal portion meets said ferrule receiving portion of said mold die;

placing said lead frame with said optical module principal portion secured thereto at said mold die; and resin-molding said lead frame and said optical module principal portion by means of said mold die;

wherein said securing step comprises the steps of:

preparing said jib, said jig having a ferrule attachment portion and a lead frame positioning portion so as to correspond to said ferrule receiving portion and positioning portion of said mold die, respectively, said ferrule attachment portion and lead frame positioning portion allowing said optical module principal portion to be positioned with respect to said lead frame;

placing said lead frame on said jig such that said alignment hole of said lead frame aligns with said lead frame positioning portion of said jig;

mounting said optical module principal portion on said lead frame placed at said jig such that said ferrule included in said optical module principal portion aligns with said ferrule attachment portion; and securing said optical module principal portion mounted on said lead frame.

2. A method of making an optical module according to claim 1, wherein said optical module principal portion comprises a substrate having first, second, and third regions along a predetermined axis, said first region including a ferrule support groove having two side faces for supporting said ferrule, said second region including an optical fiber support groove having two side faces for supporting said optical fiber, said third region including an optical device mounted thereon; said optical fiber is optically coupled to said optical device and supported by said optical fiber support groove; and said ferrule covering the side face of said optical fiber is supported by said ferrule support groove.

3. A method of making an optical module according to claim 2, wherein said substrate has a groove separating said first and second regions from each other and intersecting said predetermined axis.

4. A method of making an optical module according to claim 2, wherein said substrate has a groove separating said second and third regions from each other and intersecting said predetermined axis.

5. A method of making an optical module according to claim 2, wherein said substrate is made of silicon.

6. A method of making an optical module according to claim 1, wherein said step of preparing said optical module principal portion comprises the steps:

simultaneously forming, on a substrate having first, second, and third regions along a predetermined axis, a ferrule support groove for supporting said ferrule and an optical fiber support groove for supporting said optical fiber in said first and second regions, respectively;

mounting said optical device to said third region; and placing said optical fiber and said ferrule in said optical fiber support groove and said ferrule support groove, respectively, such that said optical fiber can be optically coupled to said optical device.

7. A method of mold-encapsulating an optical module principal portion by means of a mold die having a ferrule receiving portion and a positioning portion, said method comprising the steps of:

preparing a jig having a ferrule attachment portion and a lead frame positioning portion corresponding to said ferrule receiving portion and said positioning portion of said mold die, respectively;

securing said optical module principal portion to said lead frame by means of said jig; and mold-encapsulating said secured optical module principal portion.

8. A method of making an optical module according to claim 7, wherein said optical module principal portion comprises a substrate having first, second, and third regions along a predetermined axis, said first region including a ferrule support groove having two side faces for supporting said ferrule, said second region including an optical fiber support groove having two side faces for supporting an optical fiber, said third region including an optical device mounted thereon; said optical fiber is optically coupled to said optical device and supported by said optical fiber support groove; and said ferrule covering a side face of said optical fiber is supported by said ferrule support groove.

9. A method of making an optical module according to claim 8, wherein said substrate has a groove separating said first and second regions from each other and intersecting said predetermined axis.

10. A method of making an optical module according to claim 8, wherein said substrate has a groove separating said second and third regions from each other and intersecting said predetermined axis.

11. A method of making an optical module according to claim 8, wherein said substrate is made of silicon.

* * * * *